United States Patent [19]

Suzuki et al.

[11] Patent Number: 5,503,878
[45] Date of Patent: Apr. 2, 1996

[54] METHOD OF PREPARING THIN FILM RESISTORS

[75] Inventors: Mikimasa Suzuki, Toyohashi; Makio Iida, Ichinomiya; Makoto Muto, Ayase, all of Japan

[73] Assignee: Nippondenso Co., Ltd., Kariya, Japan

[21] Appl. No.: 292,050

[22] Filed: Aug. 18, 1994

Related U.S. Application Data

[63] Continuation of Ser. No. 952,408, Sep. 30, 1994, abandoned.

[30] Foreign Application Priority Data

Sep. 30, 1991 [JP] Japan ...................................... 3-251925

[51] Int. Cl.$^6$ .................................................... H05H 1/00
[52] U.S. Cl. ........................... 427/539; 427/259; 427/537; 437/47; 437/60; 437/918; 216/67; 216/48; 216/79
[58] Field of Search ................... 427/537, 539, 427/259; 437/47, 60, 918; 156/653

[56] References Cited

U.S. PATENT DOCUMENTS

| | | | |
|---|---|---|---|
| 3,381,255 | 4/1968 | Youmans | 338/308 |
| 4,391,846 | 7/1983 | Raymond | 427/99 |
| 4,392,992 | 7/1983 | Paulson et al. | 252/512 |
| 4,510,178 | 4/1985 | Paulson et al. | 427/94 |
| 4,520,342 | 5/1985 | Vugts | 338/308 |
| 4,569,742 | 2/1986 | Schuetz | 204/192 F |
| 4,591,821 | 5/1986 | Paulson et al. | 338/308 |
| 4,682,143 | 7/1987 | Chu et al. | 338/307 |
| 4,746,896 | 5/1988 | McQuaid et al. | 338/314 |
| 4,758,321 | 7/1988 | Vugts | 204/192.21 |

FOREIGN PATENT DOCUMENTS

| | | |
|---|---|---|
| 0101632 | 2/1984 | European Pat. Off. |
| 50-38200 | 12/1975 | Japan. |
| 53-25442 | 3/1978 | Japan. |
| 60-261101 | 12/1985 | Japan. |
| 63-119549 | 11/1986 | Japan. |
| 63-229717 | 9/1988 | Japan. |
| 8300256 | 1/1983 | WIPO. |

OTHER PUBLICATIONS

Foreign Patent Document: Japanese 63–216960 dated Sep. 1988, English Abstract, Not Translated.

IBM Technical Disclosure Bulletin, vol. 24, No. 6, Nov. 1981, pp. 2962–2963.

*Primary Examiner*—Ponnathapura Achutamurthy
*Attorney, Agent, or Firm*—Cushman, Darby & Cushman

[57] ABSTRACT

A method of preparing a patterned thin film resistor that is appropriately used in combination with semiconductor devices. The method comprises a thin film forming step comprising forming a thin film of a compound comprising at least one metal on an oxide film such as a silicon oxide film; a masking step comprising covering a desired area of the thin film by an organic material; a patterning step comprising converting to plasma a gas mixture comprising a fluorine compound gas and oxygen, and removing an area of the thin film, that is not covered by the organic material by exposing it to a gas containing activated fluorine by the plasma conversion; and a removing step comprising removing the organic material remaining on the desired area of the thin film.

11 Claims, 5 Drawing Sheets

PRIOR ART

METHOD OF PREPARING THIN FILM RESISTORS

This is a continuation of U.S. application Ser. No. 07/952,408, filed Sep. 30, 1994, now abandoned.

BACKGROUND OF THE INVENTION

1. Field of the Invention

This invention relates to a method of preparing thin film resistors used together with semiconductor devices.

2. Description of the Related Art

Japanese Examined Patent Publication (Kokoku) 2-18561 (corresponding U.S. Pat. No. 4,392,992) discloses a method of constituting a thin film resistor having a composition consisting of Cr, Si and nitrogen and used in combination with semiconductor devices. The thin film resistor formed of Cr, Si and nitrogen can be controlled, with regard to its rate of change of resistance value, at an approximately constant plus, minus or zero value within an ordinary temperature range during use of semiconductor devices, by controlling the composition and/or a heat treatment thereafter, and the method of preparing the resistor is easy. Therefore, it has become widely used, in electronic devices, etc.

For example, on a semiconductor substrate, a thick oxide film for element separation and a MOSFET (metal-oxide semiconductor field-effect-transistor) are formed. Thereafter a CVD—$SiO_2$ film as a layer insulation film is deposited, followed by the formation of a CrSiN film thereon. In order to prepare a resistor having a proper width and length so as to obtain a desired resistance value, a photoresist is applied on the CrSiN film, and is exposed and developed by well known methods so as to form a photoresist pattern with a resistor shape. Using the photoresist pattern as an etching mask, CrSiN film is etched with a wet HF-based etching liquid to form a desired CrSiN thin film resistor. After removing the photoresist on the CrSiN film, a metal electrode of Al, etc., is formed by spattering, and thereafter, an Al electrode is formed using a well known photoetching technique.

In the conventional method of etching the CrSiN film by the HF-based etching liquid, however, the etching speed of the CVD—$SiO_2$ layer insulation film under the CrSiN film using the HF-based etching liquid is the same or faster than that of the CrSiN film, so that the $CVDSiO_2$ layer insulation film under the CrSiN film is etched and a cavity is formed at the edge portion of the CrSiN thin film resistor when Al electrode wiring is formed. Therefore the reliability factor is lowered.

SUMMARY OF THE INVENTION

An object of this invention is to provide the so-called high selectivity etching method wherein the etching speed of a thin film resistor on an oxide film is faster than that of the oxide film thereunder, and provide a method of preparing a thin film resistor having a high degree of reliability and having no cavity at the edge portion of the thin film resistor.

This invention comprises a thin film forming step comprising forming a thin film of a compound comprising at least one metal on an oxide film; a masking step comprising covering a desired area of said thin film by an organic photoresist material; a patterning step comprising converting to plasma a gas mixture comprising a fluorine compound gas and oxygen, and removing an area of the thin film that is not covered by the organic material by exposing it to a gas containing activated fluorine by the plasma conversion; and a removing step comprising removing the organic photoresist material remaining on the desired area of the thin film.

DETAILED DESCRIPTION OF THE PREFERRED EMBODIMENTS

The above compound comprising at least one metal, includes, for example, CrSi, NiCr, TaN, CrSiN, and the like. Among these, CrSiN is preferred, because it has good temperature characteristics and a high sheet resistivity. After annealing, Cr, Si and N are preferably present in an atomic molar ratio of Cr=1, Si=1–2.5 and 0.3–1.5.

The above fluorine compound gas, as an etchant, includes, for example, $CF_4$, $C_2F_6$, $C_3F_3$, $CCl_2F_2$, $CCl_4$, $SF_6$ and the like. Among these, $CF_4$ is preferable.

The oxygen gas includes, for example, air, pure oxygen and mixtures thereof. Among these air is preferable, because of its availability.

The gas mixture preferably comprises about 70– about 95 vol % of oxygen based on the sum of oxygen and the fluorine compound. If it is lower than about 70 vol %, the etching speed of the thin film of a compound comprising at least one metal is slow, and the ratio of the etching speed of the thin film to that of the underlying oxide film is low. If it is higher than about 95 vol %, the etching speed of the thin film of a compound comprising at least one metal is slow.

The patterning step comprises a step comprising converting the gas mixture to plasma in a first vessel; a step comprising introducing into a second vessel connected to the first vessel the gas activated by the plasma conversion comprising fluorine; and a step comprising exposing to the introduced fluorine the organic photoresist material-uncovered area of the thin film that has been formed on the oxide film.

Figure 1:
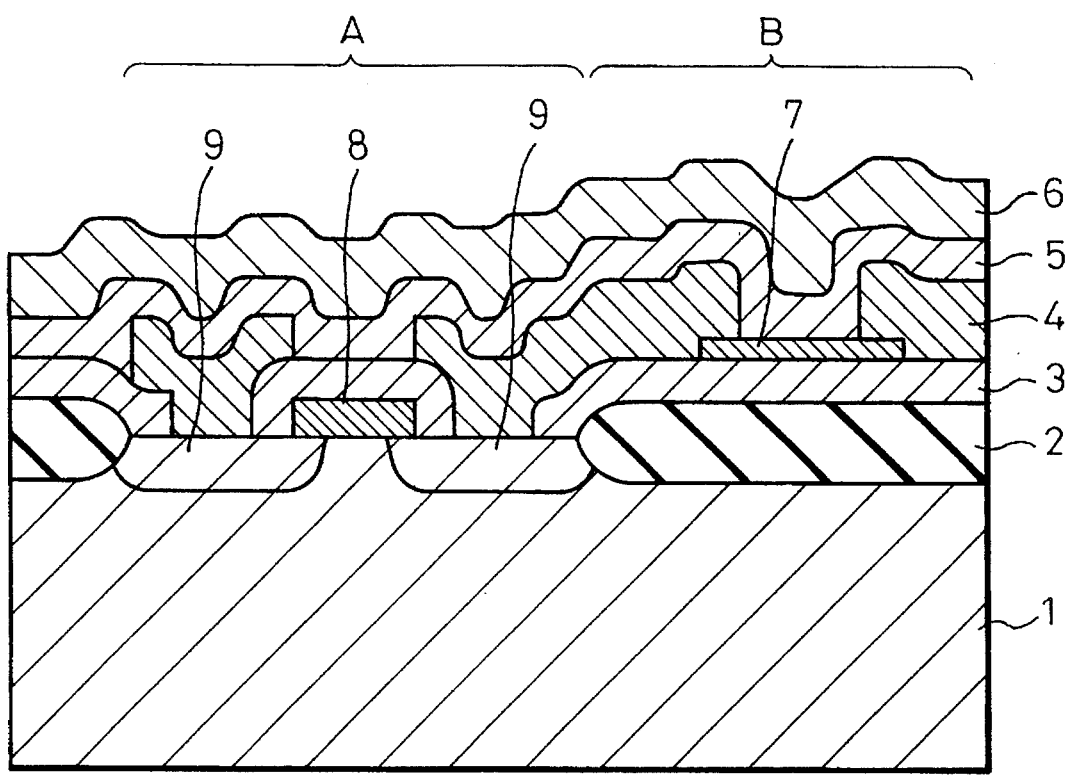
FIG. 1 is a schematic cross-sectional view of a semiconductor element including a thin film resistor.

FIG. 1 is a schematic cross-sectional view of a composite element formed by combining a CrSiN resistor and a semiconductor element. On a semiconductor base 1, there is formed a thick oxide film 2 for element separation, and a MOSFET comprising a gate electrode 8 formed on the substrate 1 interposing a gate oxide film therebetween, and source and drain regions 9 having another conductivity type to the semiconductor substrate 1 in the area A. Further a CrSiN thin film resistor 7 is formed on an inter-layer insulation film 3 in the area B of the thick oxide film 2. In this figure, 4 is an Al wiring electrode, and 5 and 6 are passivation films comprising PSG (phosphosilicate glass) and plasma silicon nitride films, respectively.

Figure 3A:
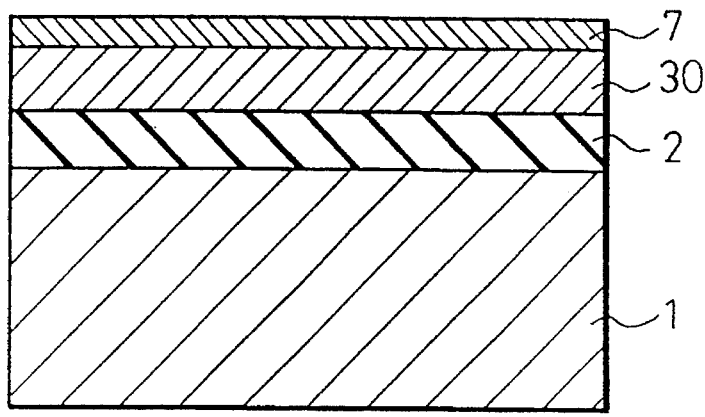
FIG. 3A, FIG. 3B and FIG. 3C are cross-sectional views showing a conventional method of preparing a thin film resistor.
Figure 3B:
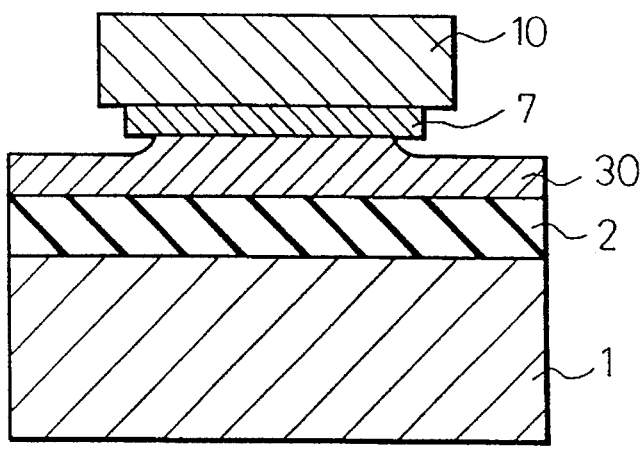
Figure 3C:
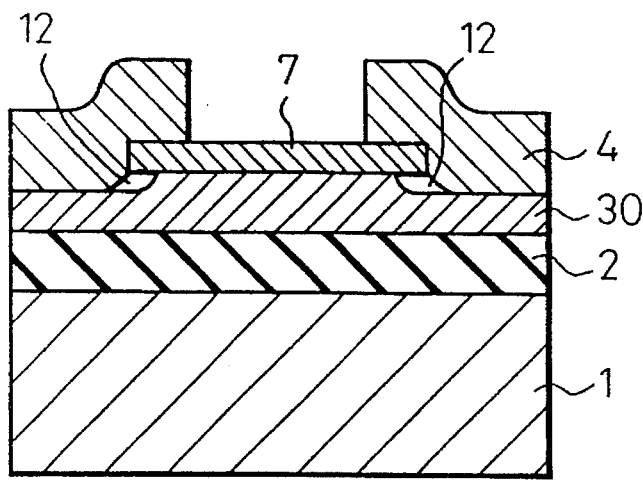

FIGS. 3A–3C are cross-sectional views showing a conventional method of preparing a CrSiN thin film resistor in the area B of FIG. 1. On a semiconductor substrate 1, a thick oxide film 2 for element separation is formed, and a MOSFET (not shown in this figure), etc., are formed on an area of the semiconductor substrate 1 (corresponding to the area A in the FIG. 1) that is not covered by the thick oxide film 2. Thereafter CVD—$SiO_2$ film is deposited as an inter-layer insulation film 30 in order to provide insulating from electrode layers. After annealing the $SiO_2$ film, a CrSiN film 7 is formed by a method shown in the above patent publication, etc., (FIG. 3A). Sometimes the CrSiN film 7 is heat-treated after it is formed. In order to prepare a resistor having a proper width and length so as to obtain a desired resistance value, a photoresist is applied on the CrSiN film 7, and is exposed and developed by well known methods so as to form a photoresist pattern 10 with a desired resistor shape. Using the photoresist pattern 10 as an etching mask, CrSiN film 7 is etched with a wet HF-base etching liquid to form a desired CrSiN thin film 7 resistor. After removing the photoresist 10 on the CrSiN film 7, a metal electrode of Al etc. is formed by spattering, and thereafter, an Al electrode 4 is formed using a well known phototeching technique. Further, if necessary, by forming a passivation film comprising PSG film 5 and plasma silicon nitride film 6 etc., a composite element comprising a CrSiN thin film resistor 7 is manufactured.

However, as mentioned above, in the conventional method of etching the CrSiN film 7 by the HF-based etching liquid, the etching speed of the CVD—$SiO_2$ layer insulation film 30 under the CrSiN film 7 using the HF-based etching liquid is the same or faster than that of the CrSiN film 7, so that the CVD—$SiO_2$ layer insulation film 30 under the CrSiN film 7 is etched and a cavity 12 is formed at the edge portion of the CrSiN thin film resistor 7 when Al electrode 4 is formed. Therefore the reliability factor is lowered.

Figure 2A:
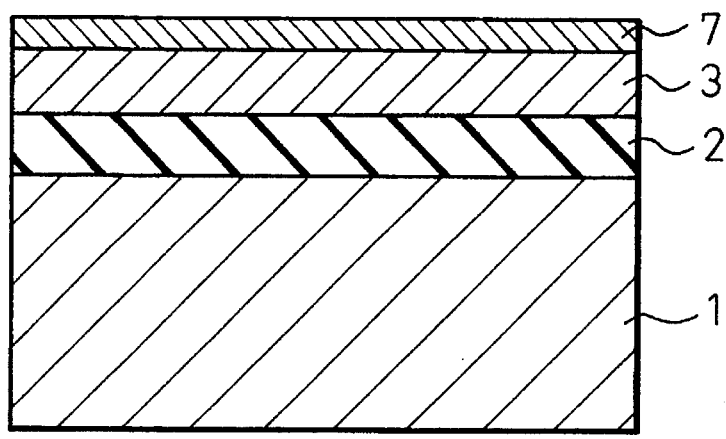
FIG. 2A, FIG. 2B and FIG. 2C are cross-sectional views showing a method of preparing a thin film resistor according to this invention.
Figure 2B:
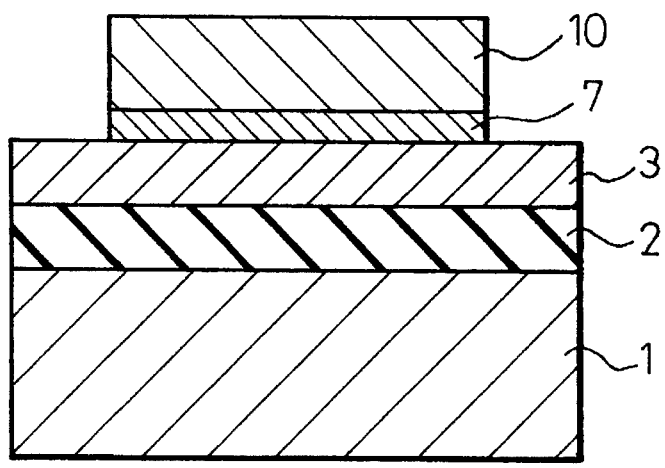
Figure 2C:
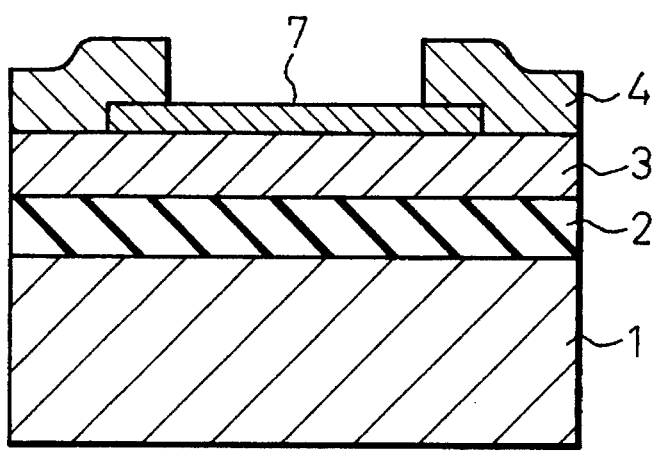

FIGS. 2A–2C show steps of forming a CrSiN thin film resistor according to an embodiment of this invention. On the Si semiconductor substrate 1, on which an element separation oxide film 2 and elements such as a MOSFET, bipolar transistor, etc., are formed by well known methods, a silicon oxide film 3 used as an interlayer insulation film for securing insulation from metal wiring is deposited by the CVD method. After annealing for about 10 minutes at 1000° C. in a nitrogen atmosphere for densification of the silicon oxide film 3, a CrSiN film 7 is deposited on the inter-layer insulation film 3 (FIG. 2A).

Here, a 150 Å CrSiN film 7 is deposited by reactive sputtering of a CrSi sintered body in an Ar atmosphere containing 1–2% of $N_2$. The sheet resistivity determining the shape of the resistor was about 500 Ω/□.

Then, in order to form a desired CrSiN thin film resistor pattern, a photoresist was applied on the CrSiN thin film and it was exposed and developed by a well known technique so as to obtain a photoresist pattern having the same shape as a desired shape of a resistor. Any suitable photoresist known in the art can be used; including, for example, novolak resins including a sensitizer.

Thereafter, the CrSiN film 7 on the silicon oxide film with the photoresist pattern 10 as an etching mask is etched by introducing $CF_4$ and oxygen at flow rates of 40 SCCM and 360 SCCM, respectively, into a plasma etching apparatus called a CDE (chemical dry etching) apparatus, and producing plasma under a pressure of 30 Pa and a power of 500 W. The ratio of the etching speed of the CrSiN film 7 to that of the underlying silicon oxide film 3 (the selection ratio) by this etching is about 16, which is not obtainable by the conventional HF-based wet etching, and thus makes it possible to obtain a good etching shape that does not intrude into the underlying silicon oxide film 3 at the edge portion of the CrSiN film 7 (FIG. 2B).

Finally, in accordance with the conventional method, a contact hole is formed and Al electrode 4 is formed to obtain a CrSiN thin film resistor having no cavity at the edge portion of the thin film resistor (FIG. 2C). Further, if necessary, a passivation film may be formed. For example, it may be a two-layered construction of a PSG film 5 and a plasma silicon nitride film 6 as shown in FIG. 1.

The inventors, in the course of attaining this invention, tried to etch a CrSiN film with a dry etching process using a plasma gas mixture of $CF_4$ and air converted in a cylindrical plasma etching apparatus and then subjected a CrSiN film to a plasma etching at temperatures ranging from room temperature to about 200° C. As a result, they discovered that the higher the temperature, the higher the etching speed of the CrSiN film. Further, they also discovered that there is a temperature range wherein the etching speed of the CrSiN film is faster than that of a silicon oxide film since the etching speed of the silicon oxide film is virtually independent of the temperature. From this fact, it is believed that the CrSiN film is etched by a fluorine radical having a temperature dependency in its generation rate. In accordance with an experiment of the inventors, a result was obtained such that when a gas of $CF_4$ mixed with 25 vol % of air is converted to a plasma under a pressure of 0.6 torr and a power of 300 W and a CrSiN film and silicon oxide film are etched by the plasma, the etching speed of the CrSiN film becomes faster than that of the silicon oxide film at a temperature, of the body to be etched, higher than about 100° C.

By using the above cylindrical plasma etching apparatus the etching selection ratio of CrSiN film/silicon oxide film was at most about 2, and the high selection ratio of etching intended by this invention could not be obtained.

Figure 5:
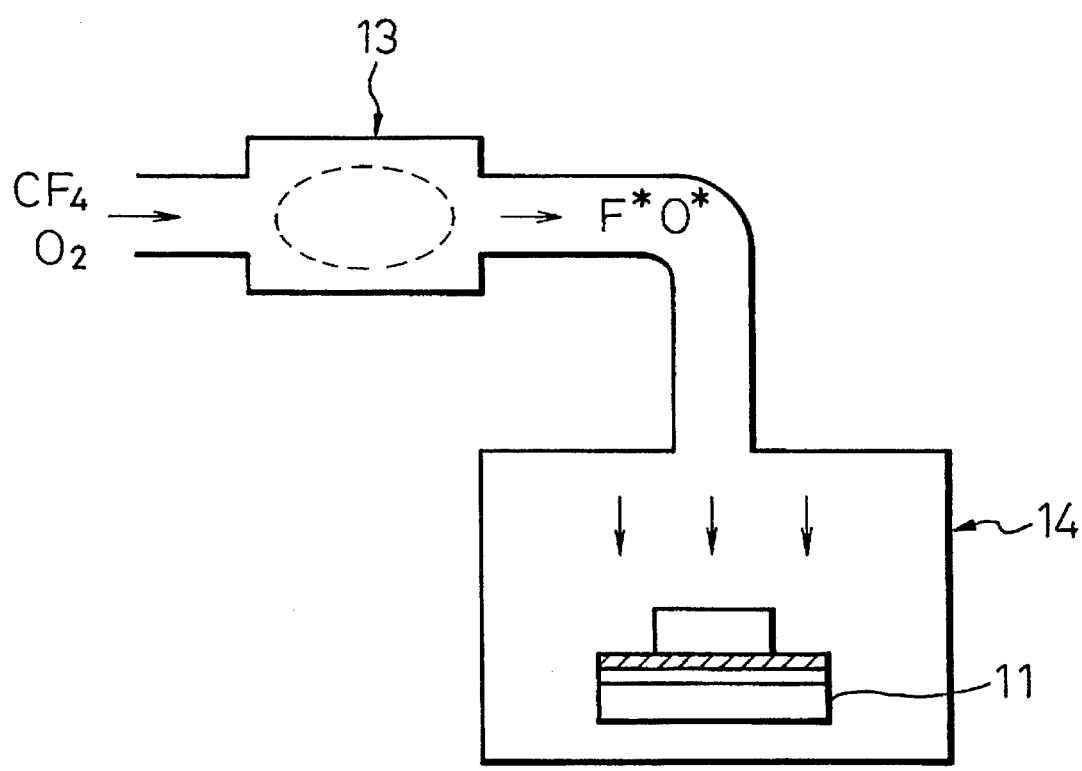
FIG. 5 is a schematic cross-sectional view of a chemical dry etching apparatus used in the preparation of a thin film resistor according to this invention.

As shown in FIG. 5 the CDE apparatus is a plasma etching apparatus having, separately, a plasma generation room 13 and an etching room 14. The plasma etching apparatus re-combines, in the plasma generation room 13, ions that are generated in the room, introduces only radicals to the etching room 14, and exposes the body 11 to be etched, thereby resulting in an etching. The inventors discovered that, in the CDE apparatus, a recombination of the ions can be promoted in the plasma generation room by increasing the amount of oxygen, which increases the amount of fluorine radical relatively, and raises the etching rate of the CrSiN film.

Figure 4:
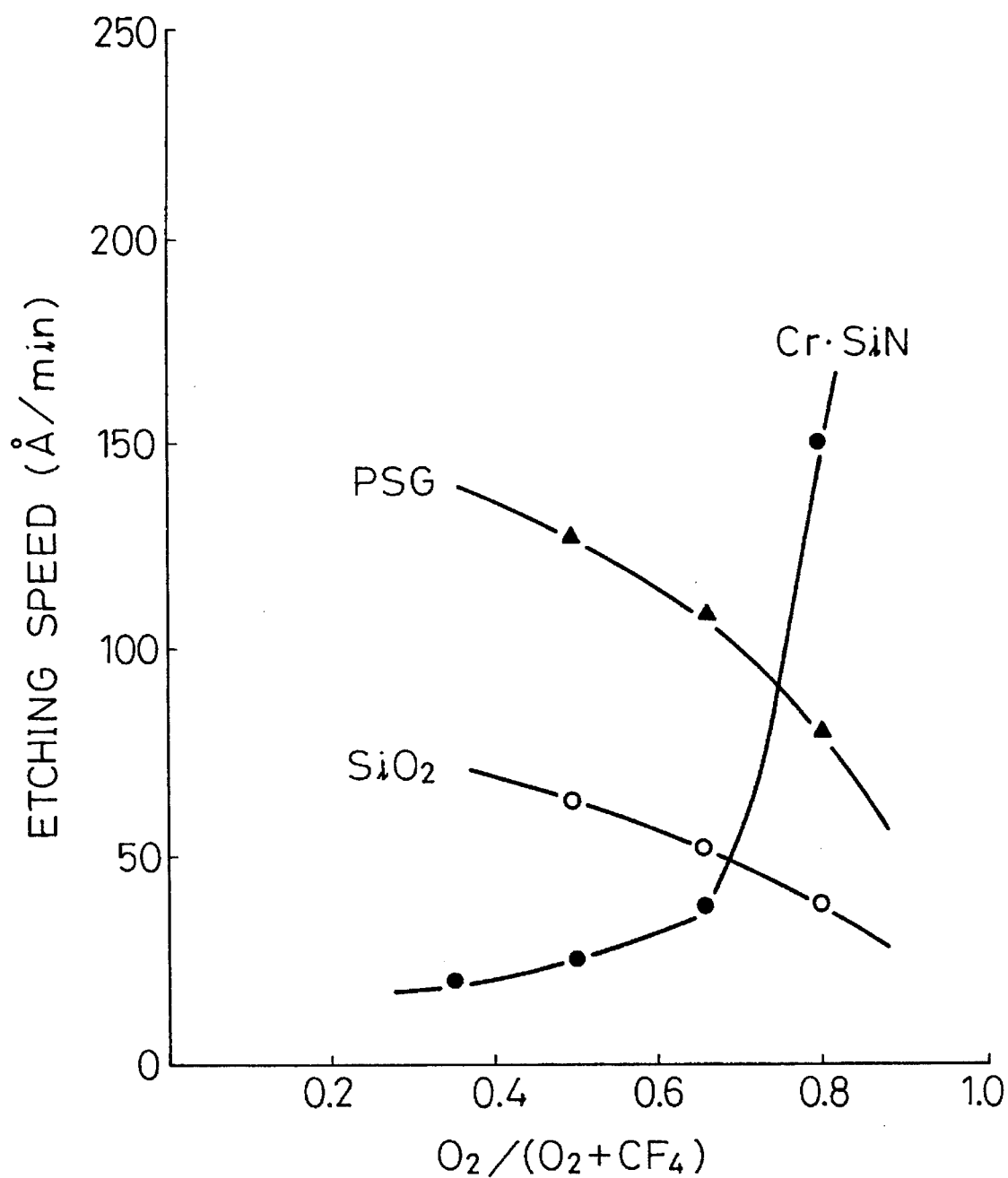
FIG. 4 is a graph showing a relation between a volume ratio of the mixed gas and the etching speed.

FIG. 4 is a graph showing the respective etching speed of CrSiN film, silicon oxide film and PSG film, when etchings are carried out at various $CF_4$ and oxygen mixing rates. This graph shows that at an oxygen mixing rate higher than about 65%, the etching speed of the CrSiN film increases drastically, however those of silicon oxide film and PSG film decrease slowly, and as a result the etching speed of the CrSiN film is greater than the silicon oxide film at an oxygen mixing rate of higher than about 70% and greater than the PSG film at an oxygen mixing rate of higher than about 75%. Incidentally, the etching experiment of FIG. 4 was carried out at room temperature.

The PSG film, which has an effect of getting impurities such as Na ion, etc., which makes the properties of the semiconductor element unstable by penetrating the element from an outer portion or inner portion, can be used as an inter-layer insulation film of another embodiment of this invention. In this case, it is apparent from FIG. 4 that the effect of this invention can be obtained. Further, as the thin film resistor, a CrSi film that does not contain nitrogen, can be used.

This invention is not limited to the above embodiments, and various modifications within the scope of the appended claims, e.g., a combination with a barrier metal, is, of course, possible.

As described above, according to this invention, since the thin film resistor is exposed to and etched with an activated fluorine in the plasma of a fluorine compound of gas and oxygen, high selectivity etching can be obtained and a highly reliable thin film resistor having no cavity at the edge portion thereof can be prepared.

We claim:

1. A method of preparing a thin film resistor comprising the steps of:

forming a thin film comprising at least one metal selected from the group consisting of Cr and Si on an oxide film;

covering a predetermined partial area of said thin film with a photoresist to thereby form a masked portion of said thin film and an exposed portion of said thin film;

converting a gas mixture comprising a fluorine compound gas and oxygen to plasma in a first vessel, said gas mixture comprising more than 70 vol % of oxygen based on the sum of the oxygen and fluorine compound, said fluorine compound being capable of forming fluorine activated by plasma conversion;

introducing said plasma into a second vessel which contains said oxide film having thereon said thin film and said photoresist; and removing said exposed portion of said thin film from said oxide film by exposing said exposed portion of said thin film to said plasma.

2. A method of preparing a thin film resistor according to claim 1, wherein said compound comprising at least one metal is a compound comprising nitrogen.

3. A method of preparing a thin film resistor according to claim 1, wherein said fluorine compound gas is carbon tetrafluoride.

4. A method of preparing a thin film resistor according to claim 1, wherein said oxide film is a $SiO_2$ film or a phosphosilicate glass film.

5. A method of preparing a thin film resistor comprising the steps of:

forming a thin film comprising at least one metal selected from the group consisting of Cr and Si on an oxide film;

covering a predetermined partial area of said thin film with a photoresist to thereby form a masked portion of said thin film and an exposed portion of said thin film;

converting a gas mixture comprising carbon tetrafluoride and oxygen to plasma in a first vessel, said gas mixture comprising more than 70 vol % of oxygen based on the sum of carbon tetrafluoride and oxygen;

introducing said plasma into a second vessel containing said oxide film having thereon said thin film and said photoresist; and removing said exposed portion of said thin film from said oxide film by exposing said exposed portion of said thin film to said plasma.

6. A method of preparing a thin film resistor comprising the steps of:

forming a thin film comprising at least one metal selected from the group consisting of Cr and Si on an oxide film;

covering a predetermined partial area of said thin film with a photoresist to thereby form a masked portion of said thin film and an exposed portion of said thin film;

converting a gas mixture comprising a fluorine compound gas and oxygen to plasma in a first vessel, said gas mixture having more than 70 vol % of oxygen based on the sum of the oxygen and fluorine compound, said fluorine compound being capable of forming fluorine activated by plasma conversion;

introducing said plasma into a second vessel containing said oxide film having thereon said thin film and said photoresist;

removing said exposed portion of said thin film by exposing said exposed portion of said thin film to said plasma and wherein the removing step is is effective to etch said thin film at a faster rate than said oxide film; and removing said photoresist from said predetermined area of said thin film.

7. A method as in claim 6, wherein said faster rate is faster by a factor of about 16.

8. A method as in claim 1, wherein said gas includes said fluorine compound gas introduced at a flow rate of 40 standard cubic cm/min, said oxygen introduced at a flow rate of 360 standard cubic cm/min and wherein said plasma etching is carried out under a pressure of 30 Pa and a power of 500 W.

9. A method as in claim 5, wherein said gas includes said fluorine compound gas introduced at a flow rate of 40 standard cubic cm/min, said oxygen introduced at a flow rate of 360 standard cubic cm/min and wherein said plasma etching is carried out under a pressure of 30 Pa in power of 500 W.

10. A method according to claim 1, wherein the method further comprises a removing step including removing the photoresist remaining on the predetermined area of the thin film.

11. A method according to claim 5, wherein the method further comprises a removing step including removing the photoresist remaining on the predetermined area of the thin film.

\* \* \* \* \*

UNITED STATES PATENT AND TRADEMARK OFFICE
CERTIFICATE OF CORRECTION

PATENT NO. : 5,503,878

DATED : April 2, 1996

INVENTOR(S) : Mikimasa SUZUKI, Makio IIDA, Makoto MUTO

It is certified that error appears in the above-identified patent and that said Letters Patent is hereby corrected as shown below:

ON THE TITLE PAGE:

Item "[63] Continuation of Ser. No. 952,408, Sep. 30, 1994, abandoned."

to --[63] Continuation of Ser. No. 952,408, Sep. 30, 1992, abandoned.--

Signed and Sealed this

Eighteenth Day of March, 1997

Attest:

BRUCE LEHMAN

*Attesting Officer*  *Commissioner of Patents and Trademarks*